(12) United States Patent
Whitney et al.

(10) Patent No.: US 6,787,380 B2
(45) Date of Patent: Sep. 7, 2004

(54) ELECTRICALLY-CONDUCTIVE GRID SHIELD FOR SEMICONDUCTORS

(75) Inventors: David Whitney, San Jose, CA (US); Anthony V. Souza, Sunnyvale, CA (US)

(73) Assignee: Vishay Infrared Components, Inc., Santa Clara, CA (US)

(*) Notice: Subject to any disclaimer, the term of this patent is extended or adjusted under 35 U.S.C. 154(b) by 0 days.

(21) Appl. No.: 10/650,352

(22) Filed: Aug. 27, 2003

(65) Prior Publication Data

US 2004/0035598 A1 Feb. 26, 2004

Related U.S. Application Data

(62) Division of application No. 09/547,475, filed on Apr. 12, 2000, now Pat. No. 6,630,623.

(51) Int. Cl.⁷ .................................................. H01L 21/00
(52) U.S. Cl. .............................. 438/22; 438/57; 438/17; 438/69; 438/110; 438/584
(58) Field of Search .......................... 438/22–25, 14–15, 438/17, 57, 69, 110, 116, 584

(56) References Cited

U.S. PATENT DOCUMENTS 5,166,772 A 11/1992 Soldner et al.
6,184,521 B1 2/2001 Coffin, IV et al.

*Primary Examiner*—Savitri Mulpuri
(74) *Attorney, Agent, or Firm*—McKee, Voorhees & Sease, P.L.C.

(57) ABSTRACT

An electrically-conductive grid placed between an LED and a photodiode prevents false triggers of the photodiode by transient electrical fields. The grid terminates the field but allows light output of the LED to pass to the photodiode.

8 Claims, 3 Drawing Sheets

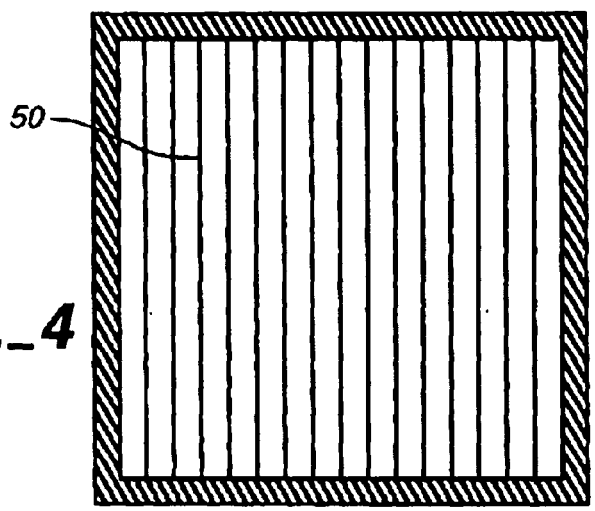
FIG._4
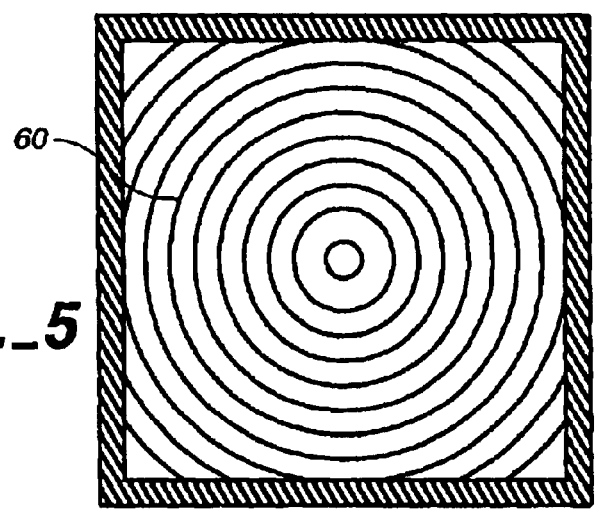
FIG._5
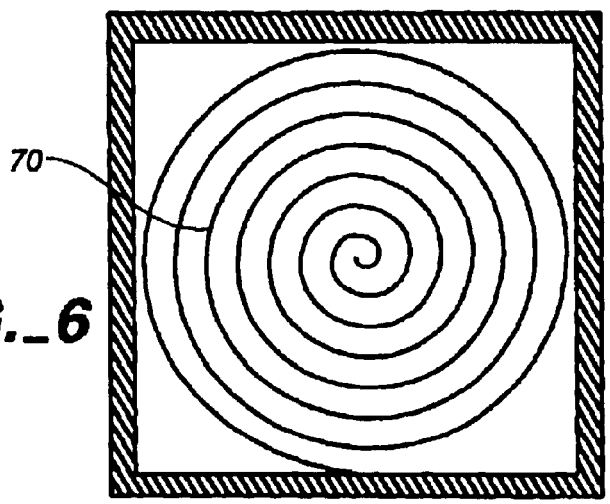
FIG._6

ELECTRICALLY-CONDUCTIVE GRID SHIELD FOR SEMICONDUCTORS

CROSS-REFERENCE TO RELATED APPLICATION

This application is a divisional application of and claims priority from Ser. No. 09/547,475 filed Apr. 12, 2000 now U.S. Pat. No. 6,630,623 and entitled "ELECTRICALLY-CONDUCTIVE GRID SHIELD FOR SEMICONDUCTORS" hereby incorporated herein by reference in its entirety.

BACKGROUND

In semiconductor devices, a transient electrical field may induce currents that result in false indications. Optocouplers may be especially susceptible to such phenomena when a high voltage pulse is received at the input stage. To overcome this problem, an electrically-conductive shield is provided to terminate and dissipate the electrical field while allowing light to pass.

BRIEF DESCRIPTION OF THE DRAWINGS

FIG. 4 illustrates a shield fashioned from parallel lines.

FIG. 5 illustrates a shield fashioned from concentric circles

FIG. 6 illustrates a shield fashioned from a spiral line.

SUMMARY

In one aspect, the invention is directed to a shielded semiconductor device. The device has semiconductor structure with a surface and a photodiode, and a shield with one or more electrically conductive elements and one or more apertures therethrough. The shield is deposited over a portion of the surface of the semiconductor structure to prevent electricla fields from reaching the photodiode and permit light to pass through the apertures to the photodiode.

Implementations of the invention may include one or more of the following features. The electrically conductive elements may define a grid, a series of parallel lines, concentric circles, or a spiral, and may be fabricated from a conductor such as aluminum, copper, gold, silver, polysilicon, or a silicide. The electrically-conductive elements may be fabricted from an interconnect layer. The electrically conductive elements may be connected to ground potential or another potential.

DETAILED DESCRIPTION

Figure 1:
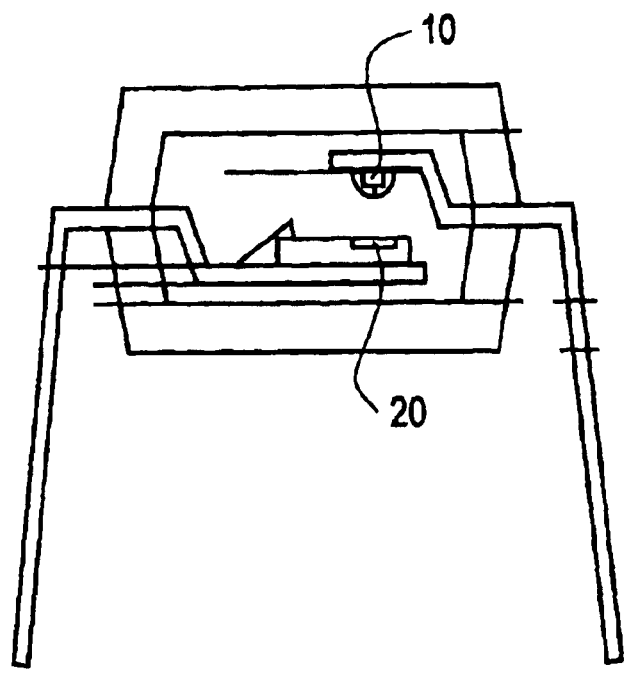
FIGS. 1 and 2 are cross-sections of an optocoupler.
Figure 2:
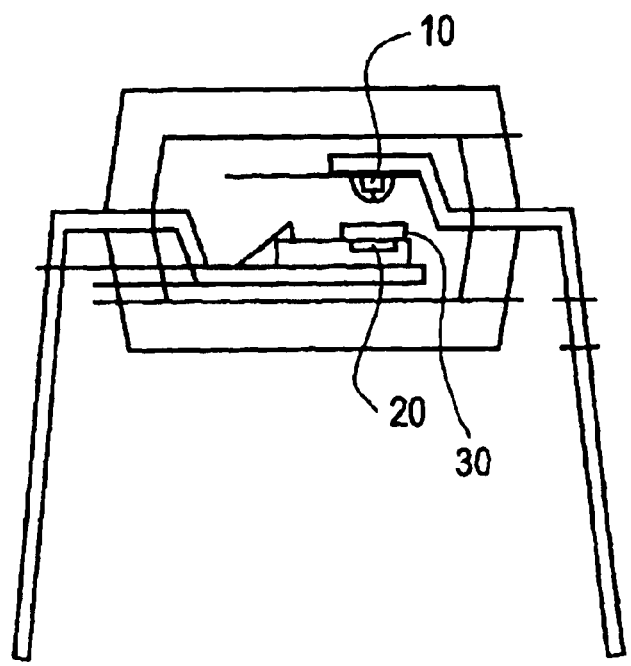

A cross-section of an optocoupler is shown in FIG. 1. There, a light-emitting diode (LED) 10 generates light that impinges on the surface of a photodiode 20. If a transient electrical signal, such as a spike, appears at the input to the coupler, care must be taken to avoid transmission from the LED 10 to the photodiode 20. When a large impulse signal appears at the input to the optocoupler, an electric field may be generated at the LED 10. If the signal is large enough, the field will cross over to the photodiode 20, inducing a current in the photodiode 20. Such false indications can be avoided by placing a shield 30 to terminate the electric field between the LED 10 and the photodiode 20, as shown in FIG. 2. The electrical shield 30 allows some portion of the light output of the LED 10 to pass through, but terminates the electrical field.

Figure 3:
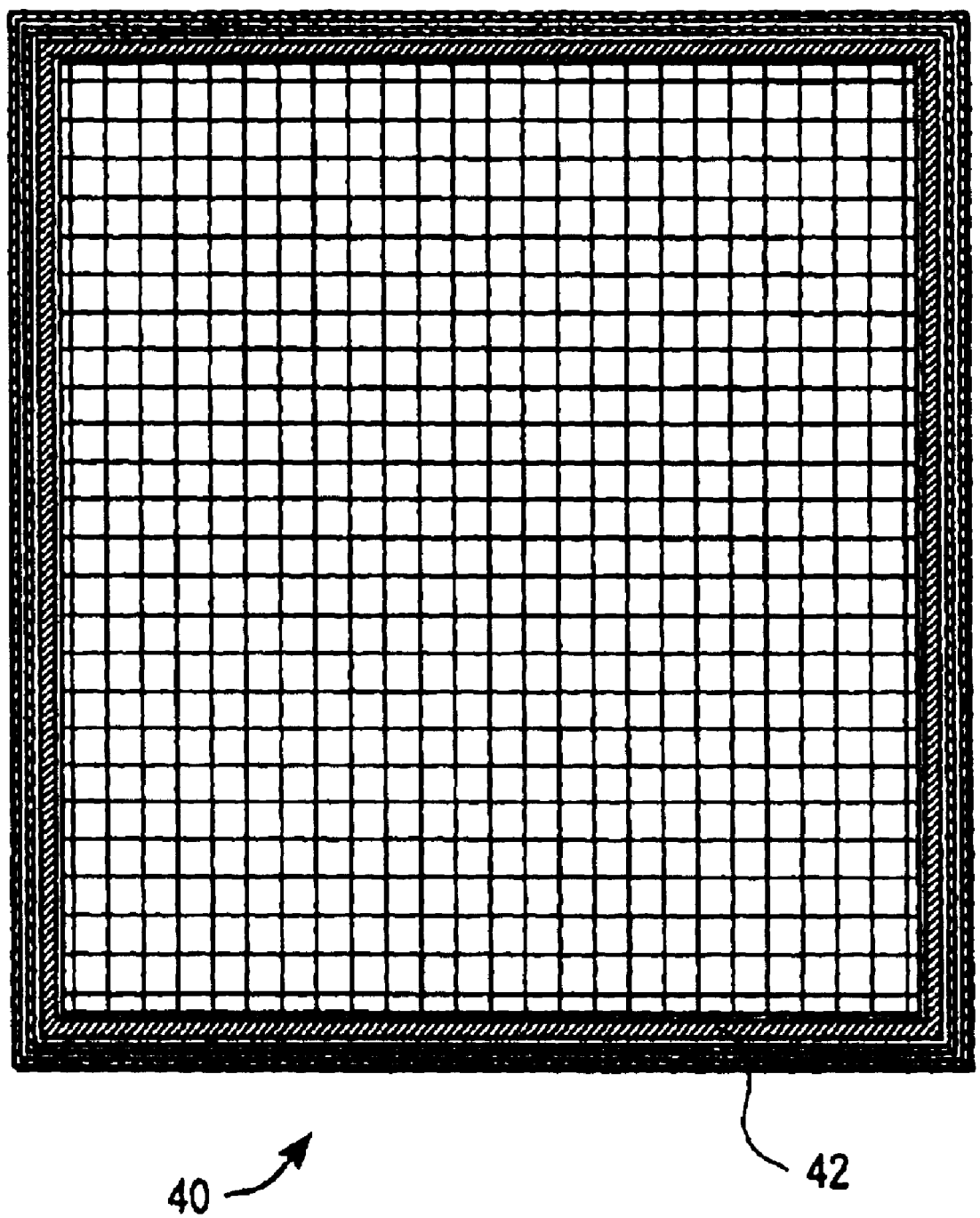
FIG. 3 illustrates a grid for shielding a photodiode.

The shield 30 can be fashioned as a grid of intersecting lines defining square, rectangular, triangular, or openings of other shapes. A grid 40 of square openings is shown in FIG. 3.

The shield 30 (or grid 40) could be deposited directly on the photodiode 20 as a layer having a thickness of 100 Å to 20,000 Å, depending on the process employed to fabricate the underlying devices. Alternatively, where the process provides a metallic interconnect layer, a portion of that layer can be utilized, isolating a section of the layer to create the shield 30 or grid 40.

The lines used to create the shield 30 or grid 40 could be as wide (or narrow) as the photolithographic process allows, e.g., 0.2 μm, up to any desired width, and the spacing between the lines could be the same as the line width or greater to achieve a blockage of almost 90% or less. As an upper limit, one might select a spacing-to-line-width ratio of twenty-to-one, although other ratios, greater or lesser, could be chosen to suit the application. Grids having lines 1 μm in thickness and spaced at 10 μm, providing a blockage of approximately 10%, have been created successfully. Where a preexisting interconnect layer is employed, the design rules for the grid will be predefined by the process.

Instead of a grid of intersecting lines, the shield 30 could be fashioned by depositing a series of parallel lines 50 as shown in FIG. 5, concentric circles 60 as shown in FIG. 5, or a spiral 70 as shown in FIG. 6, again blocking the electrical field but allowing light to pass.

The lines could be fabricated from any electrically-conductive material, such as aluminum, copper, gold, silver, polysilicon, and silicides.

The shield 30 or grid 40 would be connected to a point at ground potential or another potential to help discharge any induced field. As shown in FIG. 3, a border 42 at the periphery of the grid 40 provides a convenient connection point.

The shield 30 may be employed in devices other than optocouplers, i.e., in any device where an electrical field requires termination.

What is claimed is:

1. A method for fabricating an optocoupler, the method comprising:

disposing a shield on a photodiode, wherein the shield is configured to prevent electrical fields from reaching the photodiode, and wherein the shield includes one or more apertures through which light can pass to the photodiode wherein the step of disposing a shield on a photodiode includes disposing a shield including electrically conductive elements that define a concentric circles or a spiral; and enclosing a light emitting diode with the photodiode and the shield inside a device package such that light generated by the light emitting diode travels through an inner space defined by the device package to the photodiode for detection.

2. The method of claim 1, further comprising:

fabricating the photodiode in a semiconductor structure.

3. The method of claim 2, wherein:

disposing the shield on the photodiode includes depositing one or more electrically conductive elements over a portion of a surface of the semiconductor structure.

4. The method of claim 3, wherein:

depositing one or more electrically conductive elements includes depositing one or more conductive materials over a portion of the surface of the semiconductor structure, wherein the conductive materials include one or more of aluminum, copper, gold, silver, polysilicon, and a silicide.

5. The method of claim 3, wherein:
depositing one or more electrically conductive elements includes depositing the electrically conductive elements as a portion of a metallic interconnect layer.

6. The method of claim 3, wherein:
depositing one or more electrically conductive elements includes depositing a conductive layer having a thickness of about 100 Å to about 20,000 Å.

7. The method of claim 3, wherein:
depositing one or more electrically conductive elements includes depositing electrically conductive elements having a line width that is between about 0.2 μm and about 1 μm.

8. The method of claim 1, wherein the device package includes electric leads, the method further comprising:
electrically connecting the photodiode or the light emitting diode to the electric leads of the device package.

* * * * *